(12) United States Patent
Chiou et al.

(10) Patent No.: US 9,646,695 B2
(45) Date of Patent: May 9, 2017

(54) CONTENT ADDRESSABLE MEMORY AND MEMORY CELL THEREOF

(71) Applicant: National Cheng Kung University, Tainan (TW)

(72) Inventors: Lih-Yih Chiou, Tainan (TW); Tsai-Kan Chien, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 15/063,345

(22) Filed: Mar. 7, 2016

(65) Prior Publication Data

US 2016/0284408 A1    Sep. 29, 2016

(30) Foreign Application Priority Data

Mar. 23, 2015   (TW) .............................. 104109245 A

(51) Int. Cl.
*G11C 15/00*   (2006.01)
*G11C 15/04*   (2006.01)
*G11C 13/00*   (2006.01)

(52) U.S. Cl.
CPC ........ *G11C 15/046* (2013.01); *G11C 13/0002* (2013.01); *G11C 13/0007* (2013.01); *G11C 15/04* (2013.01); *G11C 2213/74* (2013.01); *G11C 2213/79* (2013.01)

(58) Field of Classification Search
CPC ....... G11C 15/04; G11C 15/046; G11C 15/00; G11C 11/56; G06F 17/30982
USPC ........... 365/49.1, 49.16–49.17, 148; 711/108
See application file for complete search history.

(56) References Cited

U.S. PATENT DOCUMENTS 8,837,188 B1 *   9/2014   Krishnamurthy .... G11C 15/046
                                                              365/49.1

* cited by examiner

*Primary Examiner* — David Lam
(74) *Attorney, Agent, or Firm* — Chieh-Mei Wang

(57) ABSTRACT

A memory cell includes a set of storage switch units, a set of memory units, a set of comparison switch units and a discharge switch unit. The storage switch units are turned on by a turn-on signal transmitted by a word line. The memory units receive and store write data transmitted by a bit line or a source line when the storage switch units are on under a write mode. The comparison switch units are turned on by comparison data transmitted by comparison lines under a search mode. The discharge switch unit is turned on by a detection voltage under the search mode when the comparison data transmitted by the comparison lines is different from the write data stored in the memory units, so that the reference signal transmitted to the comparator is redirected to a reference voltage. A content addressable memory using the memory cell is also provided.

13 Claims, 5 Drawing Sheets

CONTENT ADDRESSABLE MEMORY AND MEMORY CELL THEREOF

TECHNICAL FIELD

The present invention relates to a memory cell and a resistive content addressable memory, and more particularly to a memory cell and a resistive content addressable memory with a simplified circuit structure.

BACKGROUND

To conserve energy, today most of the portable, wearable, wireless sensor network and other electronic products are designed to be low in power consumption and compact in size. Conventionally, memory usually consumes a major part of power and occupies space of a system chip; and therefore, effective reduction of power consumption and size of memories have been a challenging issue in designing electronic products.

To solve the problems and improve conventional memories, resistive content addressable memory cell was developed. In general, resistive content addressable memory cell is widely used for data comparison in portable, wearable, wireless sensor network and other electronic products. In addition, as one of the newly-developed non-volatile memories, resistive content addressable memory is able to compare permanent reference more effectively due to their high data writing speed, low power consumption, high area density and compatible CMOS process.

However, conventional resistive content addressable memory cells require the use of dual voltage source; therefore, an extra charge pump or other voltage conversion circuit would be necessary. As a result, the circuit area as well as the time and power consumption for data writing and search operations are increased. Thus, there is a need to develop a content addressable memory to overcome the aforementioned problems.

SUMMARY

One objective of the present invention is to provide a memory cell without any additional charge pump or other voltage conversion circuits.

Another objective of the present invention is to provide a memory cell with reduced circuit area.

Still another objective of the present invention is to provide a memory cell with reduced power consumption on write and search operations and improved writing and search speeds.

Yet another objective of the present invention is to provide a content addressable memory using the aforementioned memory cell.

The present invention provides a memory cell of a content addressable memory. The content addressable memory has a write mode and a search mode. A plurality of the memory cells form a memory array. The memory cell is electrically coupled to a word line, a bit line, a source line and two comparison lines. When the content addressable memory receives a turn-on signal transmitted by the word line under the write mode, the memory cell receives write data transmitted by the bit line or the source line. When the content addressable memory receives the turn-on signal transmitted by the word line under the search mode, the memory cell receives comparison data transmitted by the comparison lines and a detection voltage transmitted by the bit line and transmits a reference signal to a comparator via a match line. Whether the comparison data is stored in a memory is determined based on the reference signal received by the comparator. The memory cell includes a set of storage switch units, a set of memory units, a set of comparison switch units and a discharge switch unit. The storage switch units are configured to be turned on by the turn-on signal transmitted by the word line. The memory units are configured to receive and store the write data transmitted by the bit line or the source line when the storage switch unit is turned on under the write mode. The comparison switch units are configured to be turned on by the comparison data transmitted by the comparison lines under the search mode. The discharge switch unit is configured to be turned on by the detection voltage under the search mode when the comparison data transmitted by the comparison lines is different from the write data stored in the memory units, so that the reference signal transmitted by the match line to the comparator is redirected to a reference voltage.

The present invention further provides a content addressable memory having a write mode and a search mode. The content addressable memory includes a first current direction selector, a second current direction selector, a position decoder, a comparator and a memory array. The second current direction selector is electrically coupled to the first current direction selector via a plurality of bit lines and a plurality of source lines. The current transmission direction of the bit lines is from the first current direction selector to the second current direction selector, and the current transmission direction of the source lines is from the second current direction selector to the first current direction selector. The bit lines or the source lines transmit write data under the write mode. The bit lines transmit a detection voltage under the search mode. The position decoder has a plurality of word lines. When the content addressable memory is under the write mode, the position decoder is configured to receive an individual turn-on command, select one of the word lines according to the individual turn-on command, and transmit a turn-on signal via the selected word line. When the content addressable memory is under the search mode, the position decode is configured to receive an all-turn-on command, select all of the word lines according to the all-turn-on command, and transmit the turn-on signal via all of the word lines. The comparator is configured to receive a reference signal transmitted by a plurality of match lines and determine whether comparison data is stored in the memory when receiving the reference signal. The memory array is comprised of a plurality of the aforementioned memory cells.

In summary, according to the architecture of the resistive content addressable memory cell provided by the present invention, the number of metal tracks is reduced, the overall size of memory is reduced, the writing and search speeds are improved, the power consumption is reduced, and the power delay product (PDP) as well as the energy delay product (EDP) are effectively reduced. In addition, the area size of the memory is reduced as charge pumps or other conventional voltage conversion circuits are no longer required.

BRIEF DESCRIPTION OF THE DRAWINGS

The present disclosure will become more readily apparent to those ordinarily skilled in the art after reviewing the following detailed description and accompanying drawings, in which.

DETAILED DESCRIPTION OF PREFERRED EMBODIMENTS

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
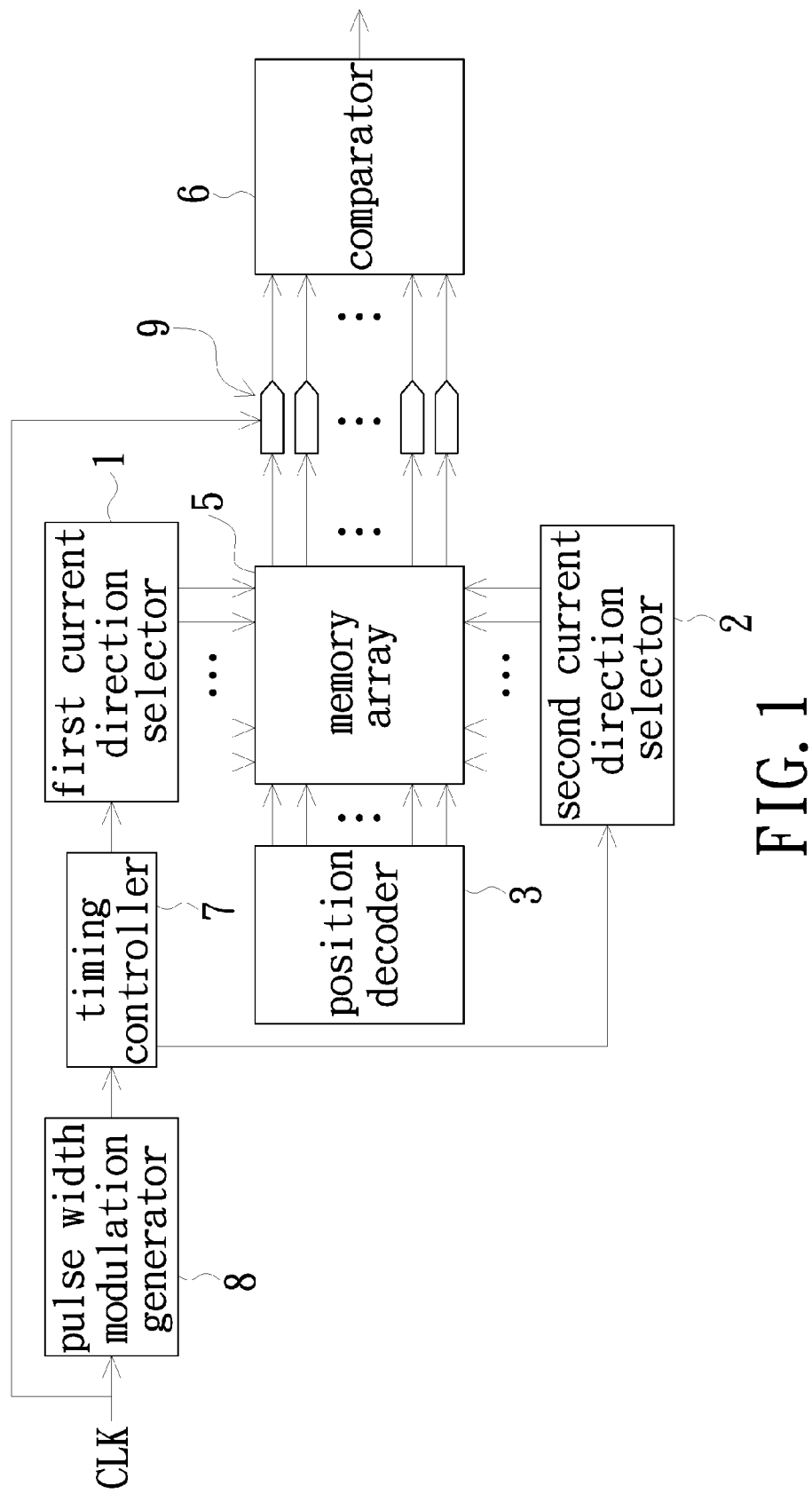
FIG. 1 is a schematic diagram of a content addressable memory in accordance with an embodiment of the present invention.

FIG. 1 is a schematic diagram of a content addressable memory in accordance with an embodiment of the present invention. The content addressable memory of the present embodiment has two operational modes during operation: a write mode and a search mode. The content addressable memory of the present embodiment includes a first current direction selector 1, a second current direction selector 2, a position decoder 3, a memory array 5, a comparator 6 and a timing controller 7. The memory array 5 is comprised of a plurality of memory cells.

Figure 2:
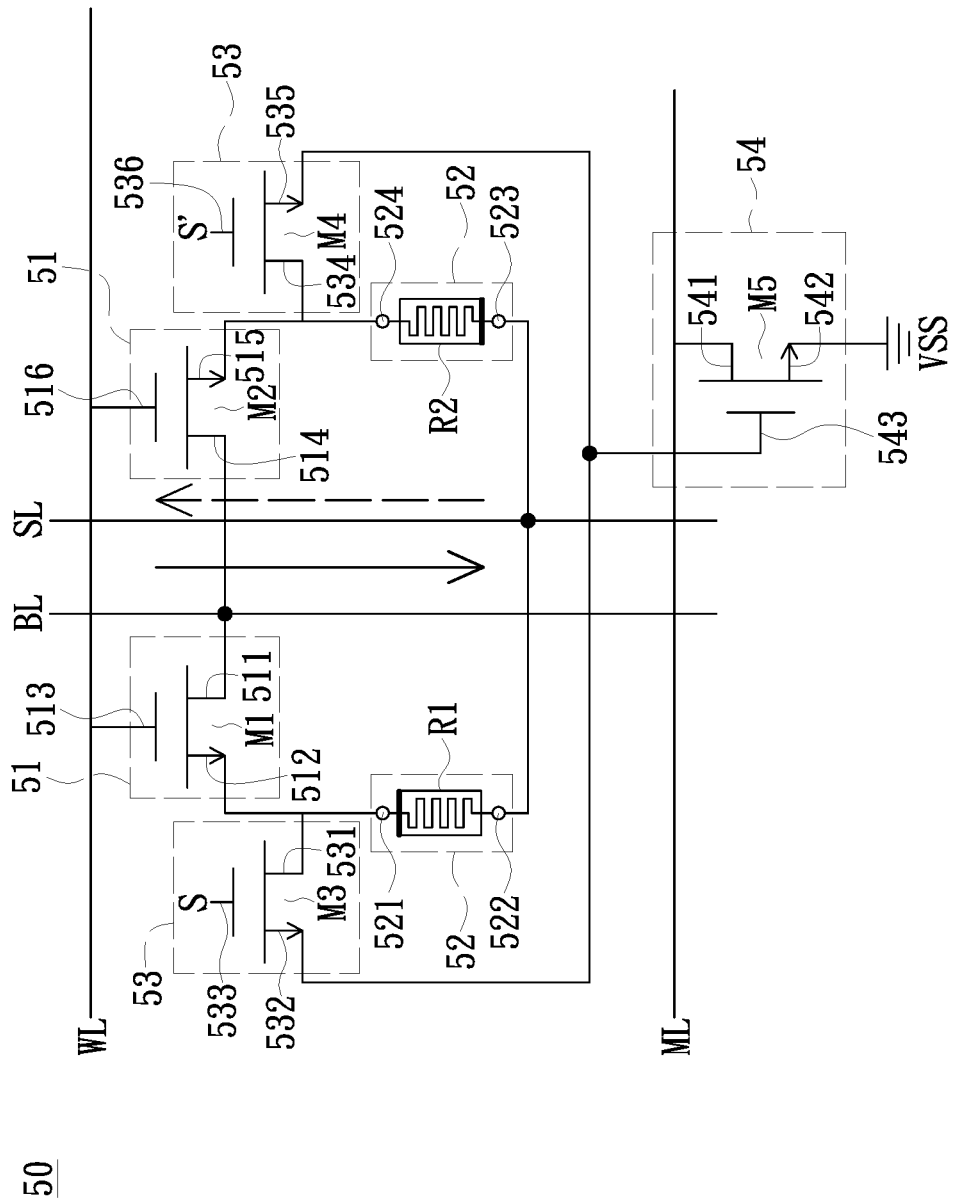
FIG. 2 is a schematic circuit diagram of a memory cell in the content addressable memory of FIG. 1 in accordance with an embodiment of the present invention.

FIG. 2 is a schematic circuit diagram of a memory cell 50 of the content addressable memory in accordance with an embodiment of the present invention. Please refer to FIGS. 1 and 2 simultaneously. As shown in the figures, the first current direction selector 1 and the second current direction selector 2 are electrically coupled with each other through a plurality of bit lines BL and a plurality of source lines SL. The current transmission direction of the bit lines BL is from the first current direction selector 1 to the second current direction selector 2; and the current transmission direction of the source lines SL is from the second current direction selector 2 to the first current direction selector 1. Under the write mode, either the bit lines BL or the source lines SL are used to transmit write data. Under the search mode, the bit lines BL are used to transmit a detection voltage. The timing controller 7 is configured to receive a clock signal CLK, generate a set of control signals according to the clock signal CLK, and control the drive time for the first current direction selector 1 and the second current direction selector 2 via the set of control signals; so that the turn-on time of the bit lines BL is different from that of the source lines SL.

Figure 3:
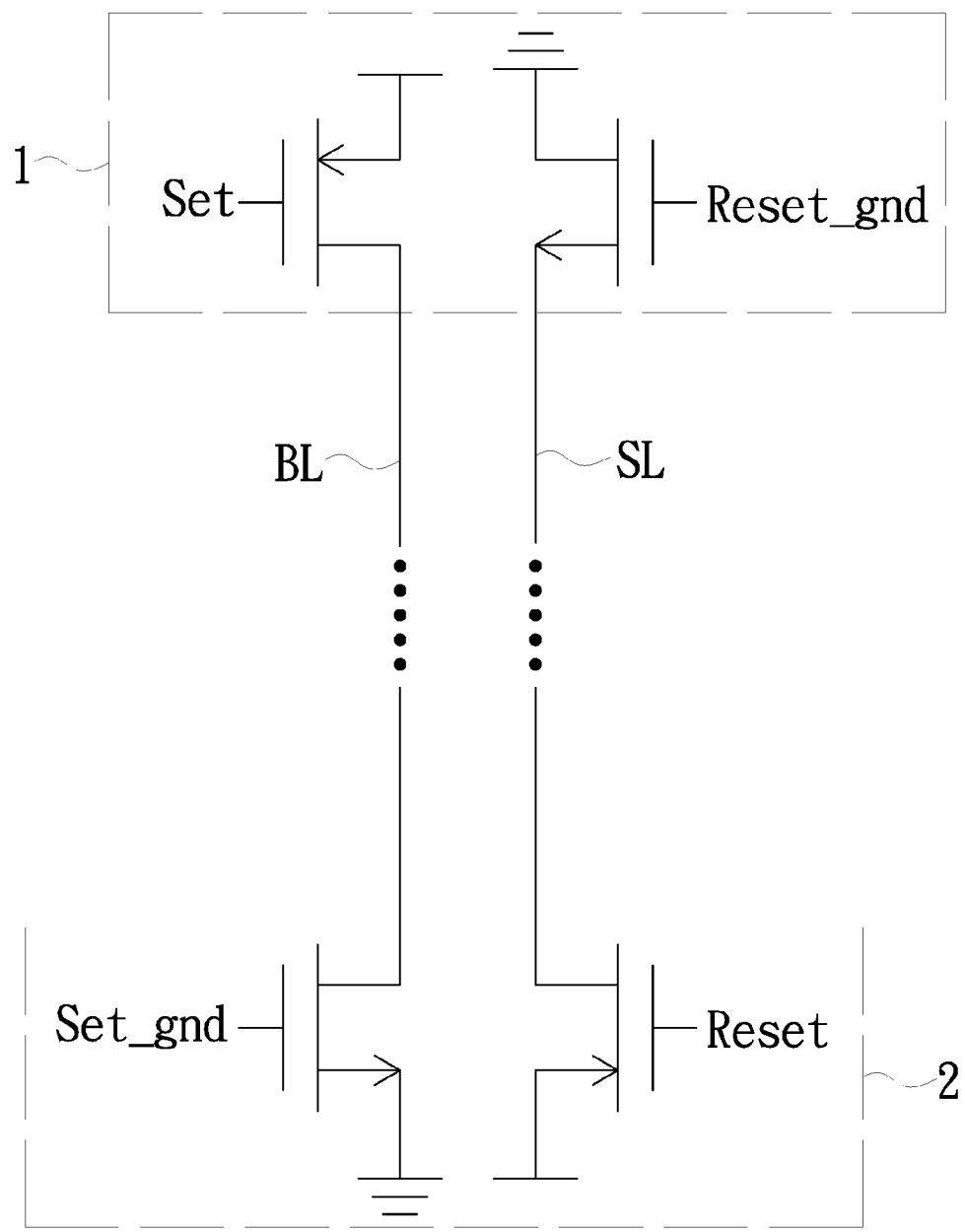
FIG. 3 is a schematic circuit diagram of the current direction selectors in FIG. 1 in accordance with an embodiment of the present invention.
Figure 4:
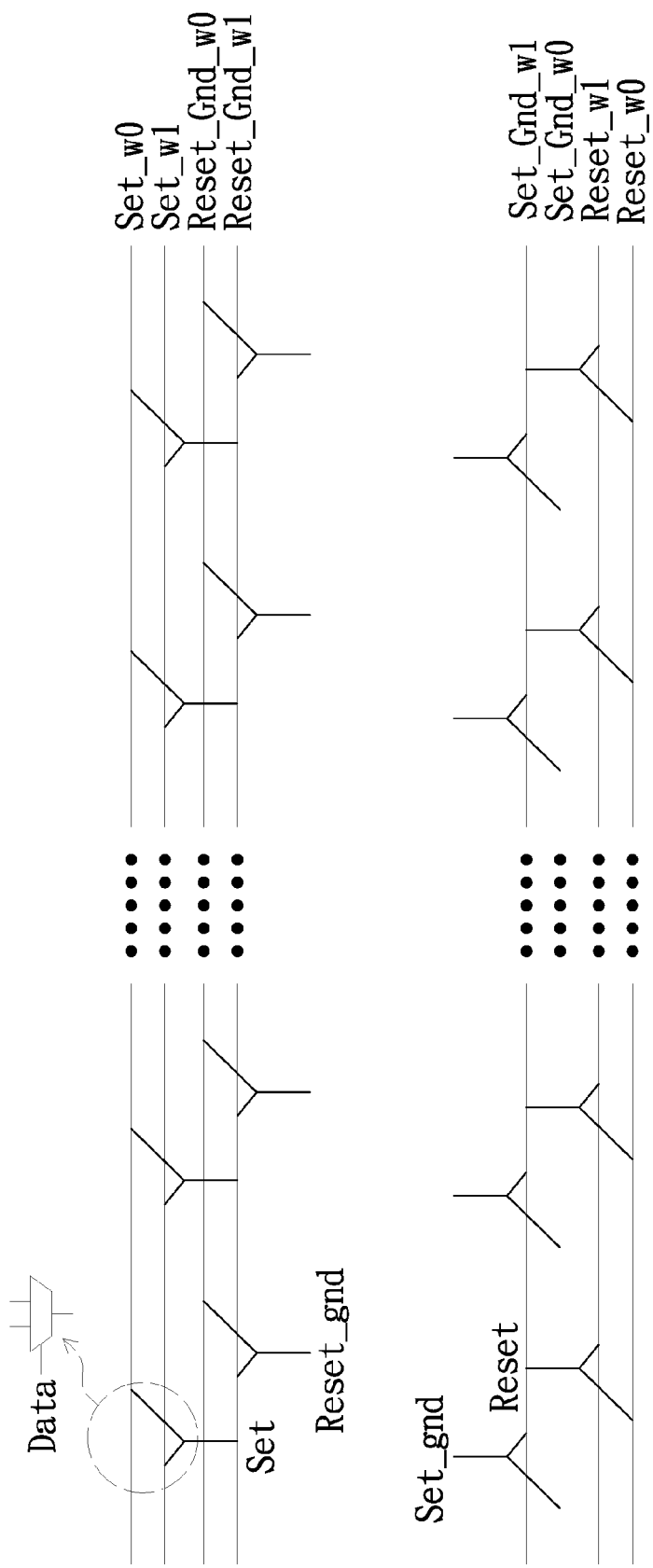
FIG. 4 is a schematic circuit diagram of the control signals used by the current direction selectors of FIG. 3 in accordance with an embodiment of the present invention.

FIG. 3 is a schematic circuit diagram of the first current direction selector 1 and the second current direction selector 2 in accordance with an embodiment of the present invention. FIG. 4 is a schematic circuit diagram of the control signals used by the current direction selectors of FIG. 3 in accordance with an embodiment of the present invention. Please refer to FIGS. 3 and 4 simultaneously. As shown in the figures, the first current direction selector 1 and the second current direction selector 2 are interchangeably disposed with a plurality of P-type transistors and N-type transistors. The timing controller 7 generates eight different control signals, including Set_w0, Set_w1, Reset_Gnd_w0, Reset_Gnd_w1, Reset_w0, Reset_w1, Set_Gnd_w0 and Set_Gnd_w1 as illustrated in FIG. 4, and uses the eight controls signals to control the current transmission directions of the bit lines BL or the source lines SL based on the write mode or the search mode. Further, in order to modulate the power of the clock signal CLK, the content addressable memory of the present embodiment may further include a pulse width modulation generator 8 as shown in FIG. 1. The pulse width modulation generator 8 is configure to module the pulse width of the clock signal CLK and transmit the modulated clock signal CLK to the timing controller 7.

The position decoder 3 has a plurality of word lines WL. When the content addressable memory is operated under the write mode, the position decoder 3 is configured to receive an individual turn-on command, select one of the word lines WL according to the individual turn-on command, and transmit a turn-on signal via the selected word line WL. On the contrary, when the content addressable memory is operated under the search mode, the position decoder 3 is configured to receive an all-turn-on command, select all of the word lines WL according to the all-turn-on command, and transmit the turn-on signal via all of the word lines WL simultaneously. The content addressable memory of the present embodiment further includes a plurality of match lines ML, and all of the match lines ML are configured for transmitting a reference signal. The comparator 6 is configured to receive the reference signal and determine whether comparison data is stored in the memory when receiving the reference signal.

Figure 5:
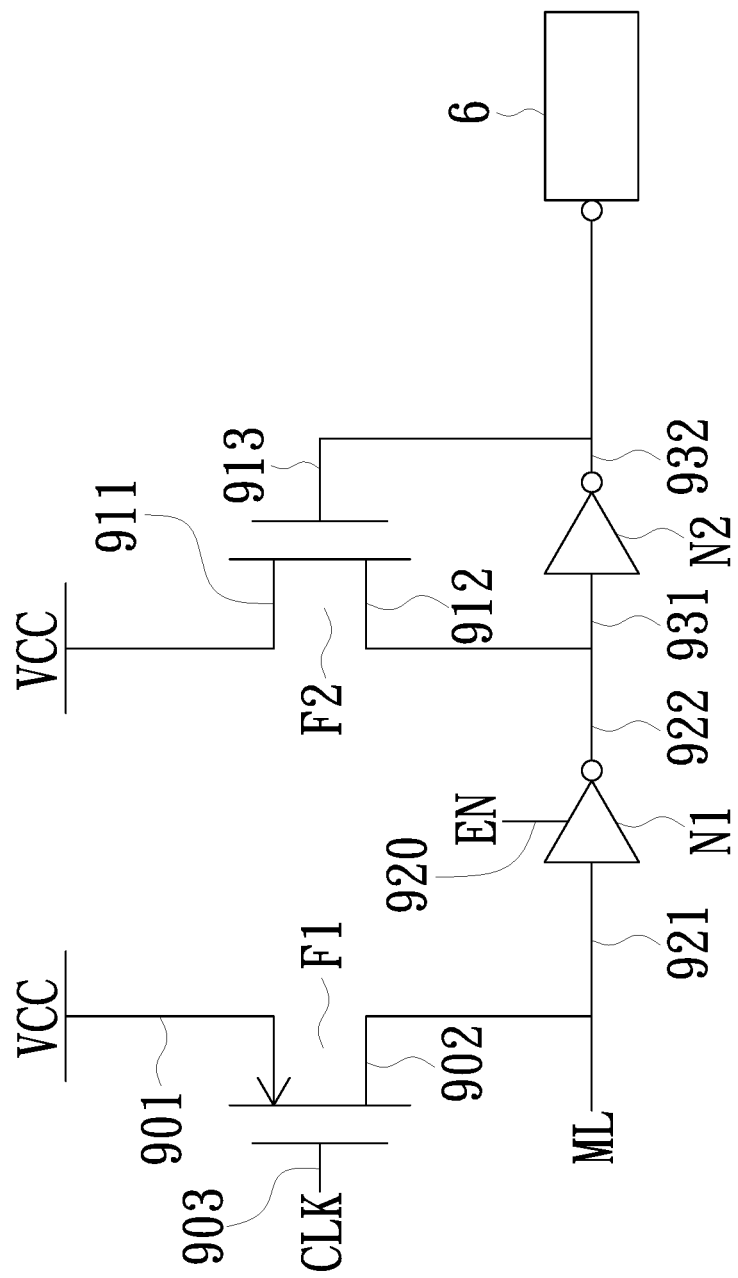
FIG. 5 is a schematic circuit diagram of the match line sensing amplifier in the content addressable memory of FIG. 1 in accordance with an embodiment of the present invention.

In order to improve the determination accuracy of the comparator 6 and enable the comparator 6 to compare one piece of data completely, the content addressable memory of the present embodiment may further include a plurality of match line sensing amplifiers 9. The match line sensing amplifiers 9 are configured to receive the reference signal outputted by the match lines ML, enlarge the gap between high level and low level of the reference signal to amplify the difference between the high and low levels, and transmit the reference signal with enlarged gap between the high and low levels to the comparator 6. FIG. 5 is a schematic circuit diagram of the match line sensing amplifier 9 in accordance with an embodiment of the present invention. As shown in FIG. 5, the match line sensing amplifier 9 of the present embodiment includes a first match line sensing transistor F1, a second match line sensing transistor F2, a first inverter N1 and a second inverter N2. The first match line sensing transistor F1 has a first source/drain 901, a second source/drain 902 and a gate 903. The second match line sensing transistor F2 has a first source/drain 911, a second source/drain 912 and a gate 913. The first inverter N1 has an input terminal 921, an output terminal 922, and a control terminal 920. The second inverter N2 has an input terminal 931 and an output terminal 932. The gate 903 of the first match line sensing transistor F1 is configured for receiving the clock signal CLK. The first source/drain 901 of the first match line sensing transistor F1 and the first source/drain 911 of the second match line sensing transistor F2 are electrically coupled to a voltage source VCC. The input terminal 921 of the first inverter N1 is electrically coupled to the second source/drain 902 of the first match line sense transistor F1 and the match line ML. The output terminal 922 of the first inverter N1 is electrically coupled to the second source/drain 912 of the second match line sensing transistor F2 and the input terminal 931 of the second inverter N2. The control terminal 920 of the first inverter N1 is configured for receiving an enabling signal EN. The output terminal 932 of the second inverter N2 is electrically coupled to the gate 913 of the second match line sensing transistor F2 and the comparator 6.

As shown in FIG. 2, the memory cell 50 of the content addressable memory is electrically coupled to a word line WL, a bit line BL, a source line SL and two comparison lines S, S'. Each memory cell 50 includes a set of storage switch units 51, a set of memory units 52, a set of comparison switch units 53 and a discharge switch unit 54. The storage switch units 51 are turned on by the turn-on signal transmitted by the word line WL. When the storage switch unit 51 is turned on under the write mode, the memory units 52 are configured to receive and store the write data transmitted by the bit line BL or the source line SL. Under the search mode, the comparison switch units 53 are turned on by the comparison data transmitted by one of the comparison lines S, S'. The discharge switch unit 54 is only used under the search mode. When the comparison data transmitted by the comparison switch units 53 is different from the write data stored in the memory units 52 under the search mode, the discharge switch unit 54 is turned on by the detection voltage transmitted by the bit line BL; therefore, the reference signal transmitted by the match line ML to the comparator 6 is redirected to a reference voltage VSS.

Specifically, as shown in FIG. 2, the storage switch units 51 include a first transistor M1 and a second transistor M2. The comparison switch units 53 include a third transistor M3 and a fourth transistor M4. The discharge switch unit 54 includes a fifth transistor M5. The memory units 52 include a first memristor R1 and a second memristor R2. The first transistor M1 has a first source/drain 511, a second source/drain 512 and a gate 513. The second transistor M2 has a first source/drain 514, a second source/drain 515 and a gate 516. The third transistor M3 has a first source/drain 531, a second source/drain 532 and a gate 533. The fourth transistor M4 has a first source/drain 534, a second source/drain 535 and a gate 536. The fifth transistor M5 has a first source/drain 541, a second source/drain 542 and a gate 543. The first memristor R1 has a non-doped terminal 521 and a doped terminal 522. The second memristor R2 has a non-doped terminal 523 and a doped terminal 524. The gate 513 of the first transistor M1 and the gate 516 of the second transistor M2 are electrically coupled to the word line WL. The first source/drain 511 of the first transistor M1 and the first source/drain 514 of the second transistor M2 are electrically coupled to each other. The second source/drain 512 of the first transistor M1 is electrically coupled to the non-doped terminal 521 of the first memristor R1. The doped terminal 522 of the first memristor R1 is electrically coupled to the non-doped terminal 523 of the second memristor R2. The doped terminal 524 of the second memristor R2 is electrically coupled to the second source/drain 515 of the second transistor M2. The gate 533 of the third transistor M3 and the gate 536 of the fourth transistor M4 are electrically coupled to the comparison lines S, S', respectively. The first source/drain 531 of the third transistor M3 is electrically coupled between the second source/drain 512 of the first transistor M1 and the non-doped terminal 521 of the first memristor R1. The second source/drain 532 of the third transistor M3 is electrically coupled to the second source/drain 535 of the fourth transistor M4. The first source/drain 534 of the fourth transistor M4 is electrically coupled between the second source/drain 515 of the second transistor M2 and the doped terminal 524 of the second memristor R2. The gate 543 of the fifth transistor M5 is electrically coupled between the second source/drain 532 of the third transistor M3 and the second source/drain 535 of the fourth transistor M4. The first source/drain 541 of the fifth transistor M5 is electrically coupled to the match line ML. The second source/drain 542 of the fifth transistor M5 is electrically coupled to the reference voltage VSS. The bit line BL is electrically coupled to the first source/drain 511 of the first transistor M1 and the first source/drain 514 of the second transistor M2. The source line SL is electrically coupled to the doped terminal 522 of the first memristor R1 and the non-doped terminal 523 of the second memristor R2.

Both the first memristor R1 and the second memristor R2 have a high resistance state (HRS) and a low resistance state (LRS) that are state switchable. When the non-doped terminal 521 of the first memristor R1 and the non-doped terminal 523 of the second memristor R2 receive the write data and the first memristor R1 and the second memristor R2 have a decreased resistance, the first memristor R1 and the second memristor R2 are switched from the high resistance state to the low resistance state; such operation is called SET, which indicates that the write data is 1. On the contrary, when the doped terminal 522 of the first memristor R1 and the doped terminal 524 of the second memristor R2 receive the write data and the first memristor R1 and the second memristor R2 have an increased resistance, the first memristor R1 and the second memristor R2 are switched from the low resistance state to the high resistance state; such operation is called RESET, which indicates that the write data is 0. Under the write mode, specifically, the write data of the first memristor R1 is 1 and the write data of the second memristor R2 is 0 if the current on the bit line BL is transmitted in the direction indicated by the solid arrow; on the contrary, the write data of the first memristor R1 is 0 and the write data of the second memristor R2 is 1 if the current on the source line SL is transmitted in the direction indicated by the dotted arrow. Under the search mode, when the comparison data of the comparison line S is 1 and the first memristor R1 is in the high resistance state, the transistor M3 is turned on by the comparison data of 1 and the transistor M5 is turned on by the detection voltage on the bit line BL, the reference signal on the match line ML is discharged to the reference voltage VSS; therefore, the comparator 6 determines that the comparison data does not match the stored write data as no reference signal is received from the match line ML. On the contrary, when the comparison data is 1 and the first memristor R1 is in the low resistance state, the reference signal on the match line ML would not be discharged to the reference voltage VSS; therefore, the comparator 6 determines that the comparison data matches the stored write data.

In summary, according to the architecture of the resistive content addressable memory cell provided by the present invention, the number of metal tracks is reduced, the overall size of memory is reduced, the writing and search speeds are improved, the power consumption is reduced, and the power delay product (PDP) as well as the energy delay product (EDP) are effectively reduced. In addition, the area size of the memory is reduced as charge pumps or other conventional voltage conversion circuits are no longer required.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell of a content addressable memory, wherein the content addressable memory has a write mode and a search mode, a plurality of the memory cells form a memory array, the memory cell is electrically coupled to a word line, a bit line, a source line and two comparison lines, wherein when the content addressable memory is in the write mode and receives a turn-on signal transmitted on the word line, the memory cell receives write data transmitted on either the bit line or the source line, wherein when the content addressable memory is in the search mode and receives the turn-on signal transmitted on the word line, the memory cell receives comparison data transmitted on the comparison lines and a detection voltage transmitted on the bit line and transmits a reference signal to a comparator through a match line, wherein whether the comparison data is stored in a memory or not is determined based on the reference signal received by the comparator, wherein the memory cell comprises:
   a set of storage switch unit, configured to be turned on by the turn-on signal of the word line;
   a set of memory unit, configured to receive and store the write data transmitted on either the bit line or the source line when in the write mode and the storage switch unit is turned on;
   a set of comparison switch unit, configured to be turned on by the comparison data transmitted on the comparison lines when in the search mode; and
   a discharge switch unit, configured to be turned on by the detection voltage when in the search mode and it is determined that the comparison data transmitted on the comparison lines is different with the write data stored in the memory unit, so that the reference signal on the match line supposed to be transmitted to the comparator is changed to be transmitted to a reference voltage.

2. The memory cell according to claim 1, wherein the storage switch unit comprises a first transistor and a second transistor, the comparison switch unit comprises a third transistor and a fourth transistor, the discharge switch unit comprises a fifth transistor, the memory unit comprises a first memristor and a second memristor, each transistor of the storage switch unit, the comparison switch unit and the discharge switch unit has a first source/drain, a second source/drain and a gate, each one of the first memristor and the second memristor has a non-doped terminal and a doped terminal, wherein the gates of the first transistor and the second transistor are electrically coupled to the word line, the first source/drain of the first transistor and the first source/drain of the second transistor are electrically coupled to each other, the second source/drain of the first transistor is electrically coupled to the non-doped terminal of the first memristor, the doped terminal of the first memristor is electrically coupled to the non-doped terminal of the second memristor, the doped terminal of the second memristor is electrically coupled to the second source/drain of the second transistor, the gates of the third transistor and the fourth transistor are electrically coupled to the two comparison lines, respectively, the first source/drain of the third transistor is electrically coupled between the second source/drain of the first transistor and the non-doped terminal of the first memristor, the second source/drain of the third transistor is electrically coupled to the second source/drain of the fourth transistor, the first source/drain of the fourth transistor is electrically coupled between the second source/drain of the second transistor and the doped terminal of the second memristor, the gate of the fifth transistor is electrically coupled between the second source/drain of the third transistor and the second source/drain of the fourth transistor, the first source/drain of the fifth transistor is electrically coupled to the match line, the second source/drain of the fifth transistor is electrically coupled to the reference voltage, the bit line is electrically coupled to the first source/drain of the first transistor and the first source/drain of the second transistor, the source line is electrically coupled to the doped terminal of the first memristor and the non-doped terminal of the second memristor.

3. The memory cell according to claim 2, wherein the memristor has a high resister state and a low resister state which are state convertible, wherein when the non-doped terminal of the memristor receives the write data, the memristor has the low resister state, wherein when the doped terminal of the memristor receives the write data, the memristor has the high resister state.

4. The memory cell according to claim 3, wherein when the third transistor is turned on by the comparison data and the first memristor has the high resister state, the gate of the fifth transistor is driven by the detection voltage and the first source/drain and the second source/drain of the fifth transistor are electrically coupled to each other, so that the reference signal is electrically coupled to the reference voltage.

5. A content addressable memory having a write mode and a search mode, the content addressable memory comprising:
   a first current direction selector;
   a second current direction selector, electrically coupled to the first current direction selector through a plurality of bit lines and a plurality of source lines, wherein the current transmission direction of the bit line is from the first current direction selector to the second current direction selector and the current transmission direction of the source line is from the second current direction selector to the first current direction selector, wherein in the write mode, ether the bit line or the source line transmits write data, wherein in the search mode, the bit line transmits a detection voltage;
   a position decoder, having a plurality of word lines, wherein when the content addressable memory is in the write mode, the position decoder is configured to receive an individual turn-on command, select one of the word lines according to the individual turn-on command, and transmit a turn-on signal through the selected word line, wherein when the content addressable memory is in the search mode, the position decode is configured to receive an all-turn-on command, select all of the word lines according to the all-turn-on command, and transmit the turn-on signal through all of the word lines;
   a comparator, configured to receive a reference signal transmitted on a plurality of match lines and determine whether comparison data is stored in the memory or not when receiving the reference signal; and
   a memory array, composed of a plurality of memory cells, wherein the memory cell is electrically coupled to the word line, the bit line, the source line and two comparison lines, the memory cell comprises;
   a set of storage switch unit, configured to be turned on by the turn-on signal of the word line;
   a set of memory unit, configured to receive and store the write data transmitted on either the bit line or the source line when in the write mode and the storage switch unit is turned on;
   a set of comparison switch unit, configured to be turned on by the comparison data transmitted on the comparison lines when in the search mode; and a discharge switch unit, configured to be turned on by the detection voltage when in the search mode and it is determined that the comparison data transmitted on the comparison lines is different with the write data stored in the memory unit, so that the reference signal on the match line supposed to be transmitted to the comparator is changed to be transmitted to a reference voltage.

6. The content addressable memory according to claim 5, further comprising a plurality of match line sense amplifiers, wherein the match line sense amplifier is configured to receive the reference signal outputted from the respective match line and enlarge a gap between a high level and a low level in the reference signal.

7. The content addressable memory according to claim 6, wherein the match line sense amplifier comprises a first match line sense transistor, a second match line sense transistor, a first inverter and a second inverter, each one of the first match line sense transistor and the second match line sense transistor has a first source/drain, a second source/drain and a gate, each one of the first inverter and the second inverter has an input terminal and an output terminal, the first inverter further has a control terminal, the gate of the first match line sense transistor is for receiving a clock signal, the first source/drain of the first match line sense transistor and the first source/drain of the second match line sense transistor are electrically coupled to a voltage source, the input terminal of the first inverter is electrically coupled to the second source/drain of the first match line sense transistor and the match line, the output terminal of the first inverter is electrically coupled to the second source/drain of the second match line sense transistor and the input terminal of the second inverter, the control terminal of the first inverter is for receiving an enable signal, and the output terminal of the second inverter is electrically coupled to the gate of the second match line sense transistor and the comparator.

8. The content addressable memory according to claim 5, further comprising a timing controller, configured to receive a clock signal and generate a group of control signals according to the clock signal, wherein the first current direction selector and the second current direction selector control the turn-on times of the bit line and the source line according to the group of control signals.

9. The content addressable memory according to claim 8, wherein the bit line and the source line are controlled to have different turn-on times.

10. The content addressable memory according to claim 8, further comprising a pulse width modulation generator, configure to module the pulse width of the clock signal and then transmit the modulated clock signal to the timing controller.

11. The content addressable memory according to claim 5, wherein the storage switch unit comprises a first transistor and a second transistor, the comparison switch unit comprises a third transistor and a fourth transistor, the discharge switch unit comprises a fifth transistor, the memory unit comprises a first memristor and a second memristor, each transistor of the storage switch unit, the comparison switch unit and the discharge switch unit has a first source/drain, a second source/drain and a gate, each one of the first memristor and the second memristor has a non-doped terminal and a doped terminal, wherein the gates of the first transistor and the second transistor are electrically coupled to the word line, the first source/drain of the first transistor and the first source/drain of the second transistor are electrically coupled to each other, the second source/drain of the first transistor is electrically coupled to the non-doped terminal of the first memristor, the doped terminal of the first memristor is electrically coupled to the non-doped terminal of the second memristor, the doped terminal of the second memristor is electrically coupled to the second source/drain of the second transistor, the gates of the third transistor and the fourth transistor are electrically coupled to the two comparison lines, respectively, the first source/drain of the third transistor is electrically coupled between the second source/drain of the first transistor and the non-doped terminal of the first memristor, the second source/drain of the third transistor is electrically coupled to the second source/drain of the fourth transistor, the first source/drain of the fourth transistor is electrically coupled between the second source/drain of the second transistor and the doped terminal of the second memristor, the gate of the fifth transistor is electrically coupled between the second source/drain of the third transistor and the second source/drain of the fourth transistor, the first source/drain of the fifth transistor is electrically coupled to the match line, the second source/drain of the fifth transistor is electrically coupled to the reference voltage, the bit line is electrically coupled to the first source/drain of the first transistor and the first source/drain of the second transistor, the source line is electrically coupled to the doped terminal of the first memristor and the non-doped terminal of the second memristor.

12. The content addressable memory according to claim 11, wherein the memristor has a high resister state and a low resister state which are state convertible, wherein when the non-doped terminal of the memristor receives the write data, the memristor has the low resister state, wherein when the doped terminal of the memristor receives the write data, the memristor has the high resister state.

13. The content addressable memory according to claim 12, wherein when the third transistor is turned on by the comparison data and the first memristor has the high resister state, the gate of the fifth transistor is driven by the detection voltage and the first source/drain and the second source/drain of the fifth transistor are electrically coupled to each other, so that the reference signal is electrically coupled to the reference voltage.

\* \* \* \* \*